United States Patent
Rodmar et al.

(10) Patent No.: US 7,153,562 B2
(45) Date of Patent: Dec. 26, 2006

(54) COATED CEMENTED CARBIDE INSERT

(75) Inventors: Markus Rodmar, Vallentuna (SE);
Mikael Lindholm, Värby (SE); Anders Jonsson, Gävle (SE); Gunilla Andersson, Solna (SE); Anders Nordgren, Enskededalen (SE); Mikael Lagerquist, Upplands Väsby (SE)

(73) Assignee: Sandvik Intellectual Property AB, Sandviken (SE)

( * ) Notice: Subject to any disclaimer, the term of this patent is extended or adjusted under 35 U.S.C. 154(b) by 157 days.

(21) Appl. No.: 10/760,387

(22) Filed: Jan. 21, 2004

(65) Prior Publication Data

US 2004/0180241 A1 Sep. 16, 2004

(30) Foreign Application Priority Data

Jan. 24, 2003 (SE) ................................ 0300175

(51) Int. Cl.
*B32B 9/00* (2006.01)
(52) U.S. Cl. .................. 428/216; 51/307; 51/309; 428/336; 428/628; 428/701; 428/702
(58) Field of Classification Search ............... 428/216, 428/336, 698, 701, 472; 51/307, 309
See application file for complete search history.

(56) References Cited

U.S. PATENT DOCUMENTS

| | | | |
|---|---|---|---|
| 4,599,281 A | 7/1986 | Schintlmeister et al. | |
| 4,984,940 A | 1/1991 | Bryant et al. | |
| 5,700,569 A | 12/1997 | Ruppi | |

FOREIGN PATENT DOCUMENTS

| | | | |
|---|---|---|---|
| EP | 0127416 A2 | 12/1984 |
| EP | 0298729 A1 | 1/1989 |
| EP | 0683244 A2 | 11/1995 |
| EP | 0693574 A1 | 1/1996 |
| EP | 1103635 A2 | 5/2001 |
| EP | 1209255 A2 | 5/2002 |
| EP | 1245698 A2 | 10/2002 |
| EP | 1245700 A1 | 10/2002 |
| GB | 2048960 A | 12/1980 |
| WO | WO99/58738 | 11/1999 |

OTHER PUBLICATIONS

Swedish Office Action dated Jul. 16, 2003.
K. Dreyer et al., "Development and tool like behaviour of super-wear-resistant multilayer coatings on hardmetals," pp. 112-117.
S. Ruppl et al., "Microstructure and deposition characteristics of κ-$Al_2O_3$," *J. Phys. IV France* 9 (1999), pp. 349-355.

Primary Examiner—Archene Turner
(74) Attorney, Agent, or Firm—Drinker Biddle & Reath LLP

(57) ABSTRACT

The present invention relates to a cutting tool insert particularly for turning of steel comprising a cemented carbide body, a coating with a post treatment with a first, innermost layer system of one or several layers of $TiC_xN_yO_z$ with $x+y+z \leq 1$ with a total thickness of 0.7–4.5 µm a second multilayer system consisting of a totally 5–31 alternating $Al_2O_3$ and $TiC_xN_yO_z$ ($x+y+z \leq 1$), preferably κ-$Al_2O_3$ and TiN, the $Al_2O_3$-layers having an individual layer thickness of <0.5 µm and the $TiC_xN_yO_z$-layers 0.01–0.2 µm with a total thickness of the multilayer of 1.0–4.0 µm. The multilayer is exposed along the edge line and into the rake and flank face, at least 0.02 mm, from the edge line on the rake face, preferably the contact length of the chip at most 0.9 mm, and 0.02–0.20 mm on the flank face.

18 Claims, 6 Drawing Sheets ps under 35 U.S.C. § 119 to

COATED CEMENTED CARBIDE INSERT

This application claims priority under 35 U.S.C. § 119 to Swedish Application No. 0300175-7 filed in Sweden on Jan. 24, 2003; the entire contents of which is hereby incorporated by reference.

FIELD OF THE INVENTION

The present invention relates to a coated cemented carbide cutting tool insert for the machining in general of steel in applications having high requirements on wear resistance and toughness behaviour of the cutting edge. The tool is particularly suitable for the turning of stainless steels.

When cemented carbide cutting tools are used in the machining of steels, the tool is worn by different mechanisms such as abrasive and chemical wear, chipping and fracturing of the cutting edge. The cutting of stainless steel is considered to be a particularly difficult machining operation since in addition to the above mentioned wear mechanisms, adhesive wear is also prominent. Adhesive wear is obtained when smearing materials like stainless steels continuously adhere to and tear off material from the cutting edge during the cutting operation. A short tool life is therefore very frequent when machining stainless steels. Furthermore, when cutting stainless steels at high cutting speeds, the thermal energy transferred to the cutting edge is considerable and the tool edge may partly or entirely deform plastically. This mode of deterioration of the cutting edge is known as plastic deformation wear. A large requirement of plastic deformation resistance is in clear contrast to a large requirement of edge toughness.

Multilayer coatings comprising first and second coating layers of different materials which are alternately laminated on the substrate, each of the first coating layers having a first thickness and each of the second coating layers having a second thickness are known. The two layers should preferably have a different crystal structure and/or at least different lattice spacings. One example of such a structure is when the $Al_2O_3$ growth periodically is interrupted by a short TiN deposition process resulting in a $(Al_2O_3+TiN)_x$ multilayer structure see e.g. Proceedings of the 12th European CVD Conference page pr.8–349. GB 2048960A discloses a multilayer coating with a multiplicity of alternating layers of 0.02 to 0.1 µm consisting of hard material of different compositions. U.S. Pat. No. 4,599,281 discloses a multilayer coating with alternating layers of an aluminium-boron mixed oxide and another oxide layer of e g Ti(C,N,O). Dreyer and Kolaska, Metals Society (Book 278), London, England (1982) 112–117 report an A—O—N multilayer. In U.S. Pat. No. 4,984,940 Bryant et al. disclose a cutting insert composed of a cemented carbide substrate with 6.1–6.5 wt % cobalt, a coating including a base layer of titaniumcarbonitride followed by a multilayered coating consisting of a plurality of alumina layers. A cemented carbide substrate with a coating comprising 6–8 alumina layers is also claimed in U.S. Pat. No. 5,700,569. WO 99/58738 describes a tool consisting of a hard wear resistant substrate and a CVD multilayer of about 50 layers. EP-A-1103635 claims a cutting tool consisting of a cemented carbide substrate with 9.0–10.9 wt % cobalt and a coating comprising a medium temperature CVD (MTCVD) deposited TiCN-layer and a multilayer composed of totally 7–41 layers of α-alumina and TiN or Ti(C,N). EP-A-1245698, EP-A-1245700, and EP-1209255 also relate to multilayer coatings.

Smoothing of coatings by mechanical post treatment in order to e g minimize the friction between the tool and the workpiece is disclosed in EP-A-127416, EP-A-298729, EP-A-693574 and EP-A-683244.

SUMMARY OF THE INVENTION

It is an object of the present invention to provide a cutting tool insert able to simultaneously withstand all the above mentioned wear modes.

It is a further object of the present invention to eliminate the deficiencies of prior art tool products and to provide a high performance cutting tool.

It is a still further object of the present invention to provide a tool with excellent cutting performance in demanding stainless steel turning operations.

In the aspect of the present invention, there is provided a coated cemented carbide cutting tool insert, said coating comprising a first, innermost layer system of at least two layers of $TiC_xN_yO_z$ with $x+y+z \leq 1$; and a second multilayer system comprising from about 5 to about 31 alternating layers of $Al_2O_3$ and $TiC_xN_yO_z$ ($x+y+z \leq 1$), the $Al_2O_3$-layers having an individual layer thickness of <0.5 µm and the $TiC_xN_yO_z$-layers from about 0.01 to about 0.2 µm with a total thickness of the multilayer from about 1.0 to about 4.0 µm, and wherein the multilayer is exposed along the edge line and into the rake and flank face, such that the exposure on the rake face (a) is greater than about 0.03 and less than about 0.9 mm, the exposure on the flank face (b) is greater than about 0.02 and less than about 0.2 mm and a>b.

DETAILED DESCRIPTION OF THE INVENTION

More specifically, the invention relates to a WC+Co-based cemented carbide substrate with additions of cubic carbides, a specific grain size range of the WC grains, a specific composition range of WC+Co and a coating on the cemented carbide substrate including an innermost thin layer of equiaxed $TiC_xN_yO_z$ followed by a layer of columnar $TiC_xN_yO_z$, a thin layer of equiaxed $TiC_xN_yO_z$, a multilayer with a periodic variation of $TiC_xN_yO_z$ and $Al_2O_3$ layers ($x+y+z \leq 1$) and an outermost layer of $TiC_xN_y$ ($x+y \leq 1$). At least the non-oxide outermost layer in areas in direct contact with material from the work-piece around the cutting edge is missing.

The composition of the cemented carbide substrate should be from about 7 to about 10.5 wt % Co, preferably from about 8.0 to about 9.5 wt % Co, and from about 0.2 to about 1.6 wt % cubic carbides, preferably from about 0.4 to about 1.0 wt % cubic carbides of the metals Ta, Nb and Ti and possibly other carbides of the elements from group IVb, Vb or VIb of the periodic table and balance tungsten carbide (WC). The preferred average grain size of the WC is from about 1.5 to about 3.5 μm, preferably from about 1.9 to about 2.1 μm.

In an alternative embodiment, the cemented carbide substrate has a cubic carbide depleted and binder enriched volume near the surface. The measured distance from the surface should be from about 5 to about 50 μm until the end of the cubic carbide depletion. In this embodiment the composition comprises from about 7.0 to about 10.5 wt % Co and from about 4.0 to about 9.0 wt % cubic carbides and balance tungsten carbide (WC). Said cubic carbides may contain substantial amounts of N and O such that certain microstructural constituents should be referred to as e.g. carbonitride or oxycarbonitride. The cubic carbides are preferably Nb, Ta and Ti but may include carbides of elements from group IVb, Vb or VIb of the periodic table. The amount of N should be in the range of from about 0.01 to about 0.2 wt %.

Figure 1:
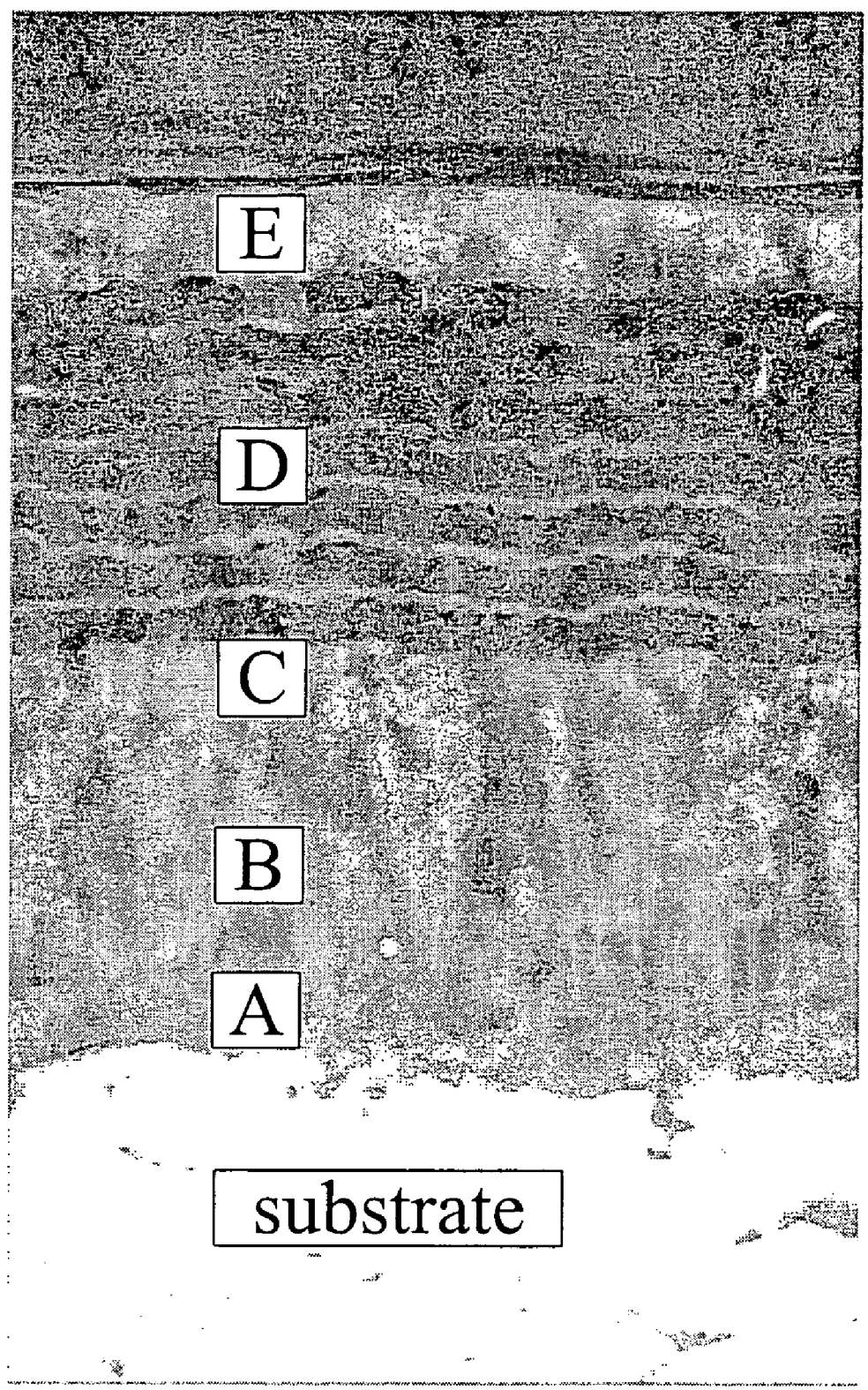
FIG. 1. is a scanning electron micrograph (SEM) of a cross-section of the coating according to the present invention in which:
A.=TiN,
B.=columnar Ti(C,N),
C.=TiN,
D.=multilayer $(Al_2O_3+TiN)_6Al_2O_3$ and
E.=TiN+TiC+TiN.

The hard and wear resistant refractory coating (FIG. 1) deposited on the cemented carbide substrate according to the present invention comprises:

- a first, innermost layer (A) of $TiC_xN_yO_z$ with $x+y+z \leq 1$, preferably y>x and z<0.2, most preferably y>0.8 and z=0, with equiaxed grains with size <0.5 μm and a total thickness <1.5 μm but >0.1 μm preferably from about 0.1 to about 0.6 μm.
- a second layer (B) of $TiC_xN_yO_z$ with $x+y+z \leq 1$, preferably with z=0, x>0.3 and y>0.3, most preferably x>0.5, with a thickness of from about 0.4 to about 3.9 μm, preferably from about 1.5 to about 3.0 μm with columnar grains.
- a third layer (C) of $TiC_xN_yO_z$ with $x+y+z \leq 1$, preferably y>x and z<0.2, most preferably y>0.8 and z=0, with equiaxed grains with size <0.5 μm and a total thickness <1.5 μm but >0.1 μm, preferably from about 0.2 to about 0.8 μm in a first embodiment. This layer (C) can be omitted in a second embodiment.
- the total thickness of the layers A+B+C is from about 0.7 to about 4.5 μm, preferably from about 1.2 to about 4.0 μm. Preferably, the layers A and C are each thinner than the layer B.
- a multilayer (D) consisting of a plurality of alternating $Al_2O_3$ and $TiC_xN_yO_z$ ($x+y+z \leq 1$) layers, preferably κ-$Al_2O_3$ and TiN layers. The innermost and the outermost layer of the multilayer sequence are $Al_2O_3$-layers. The total number of layers, including both the $TiC_xN_yO_z$- and $Al_2O_3$-layers, is between about 5 and about 31, preferably about 11 and about 15 layers. The $Al_2O_3$-layers have an individual layer thickness of <0.5 μm, preferably from about 0.2 to about 0.5 μm. The $TiC_xN_yO_z$-layers have an individual layer thickness of from about 0.01 to about 0.2 μm, preferably from about 0.02 to about 0.15 μm. The total thickness of the multilayer is from about 1.0 to about 4.0 μm, preferably from about 1.5 to about 3.5 μm. The grain size of the $Al_2O_3$-layer is equal to or less than the thickness of the $Al_2O_3$-layer.
- an outermost layer system (E) consisting of one or several layers in sequence of $TiC_xN_y$ ($x+y \leq 1$) or combinations thereof, preferably three layers in sequence of TiN, TiC, and TiN. The total thickness is <2.0 μm but >0.1 μm, preferably from about 0.2 to about 1.0 μm.
- the total thickness of the layers A–E is from about 2.0 to about 8.0 μm, preferably from about 4.0 to about 7.0 μm.

The outermost part of the coating is missing around the edge such that this area corresponds to the chip contact on the rake side and the contact with the work piece on the flank side. Most preferably this uncoated area correspond to the primary land on the rake side when a primary land exists on the geometry at hand such that the coating is missing a distance from a point defined in FIG. 2B with a perspective perpendicular to the insert face planes on the rake face "a" and on the flank face "b". These distances depend on different insert geometries and insert sizes, etc., but on the rake face, preferably correspond to 0.03<a<0.9 mm and 0.02<b<0.2 mm, independent of the existence of a primary land or not. In any case, a>b, preferably a>1.5b. In one embodiment, the layer E is missing. In another embodiment, both layers D and E are missing in those parts of the area.

Figure 2A:
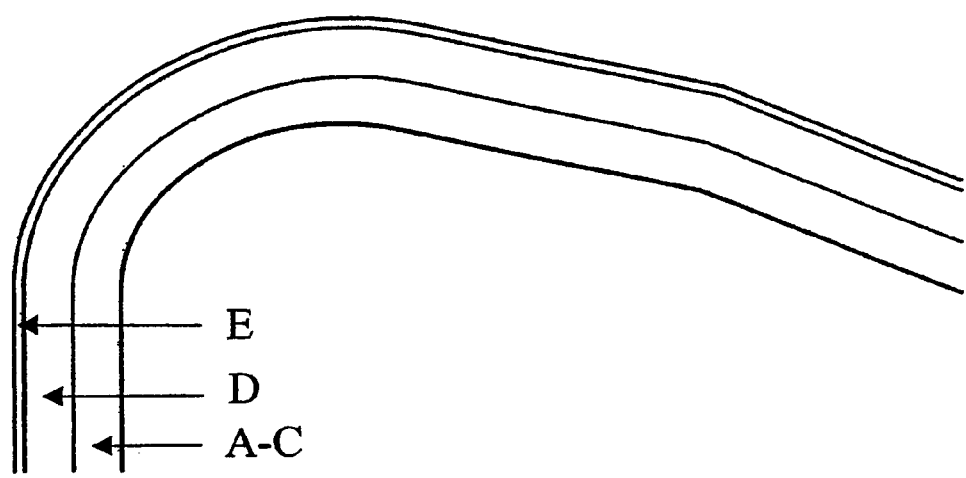
FIG. 2A is a schematic of the cross-section of the edge without a post-treatment.
Figure 2B:
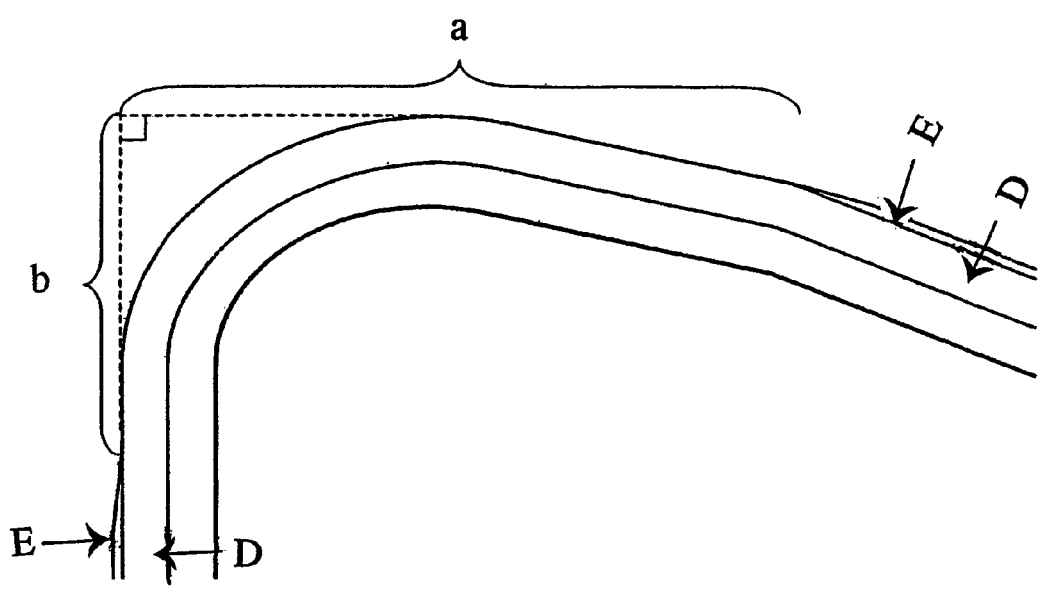
FIG. 2B is a schematic of the cross-section of the edge with a post-treatment according to the invention where the outermost coating E is removed.
Figure 2C:
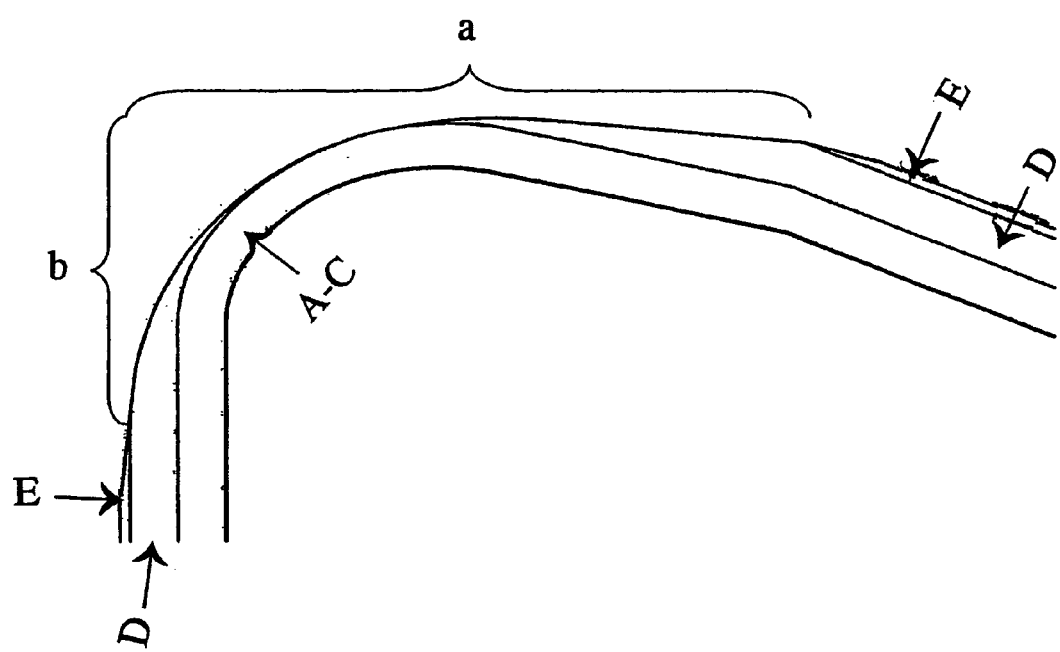
FIG. 2C is a schematic of the cross-section of the edge with a post-treatment according to the invention where the outermost coating E and the multilayer $(Al_2O_3+TiN)_xAl_2O_3$ are removed.
Figure 3:
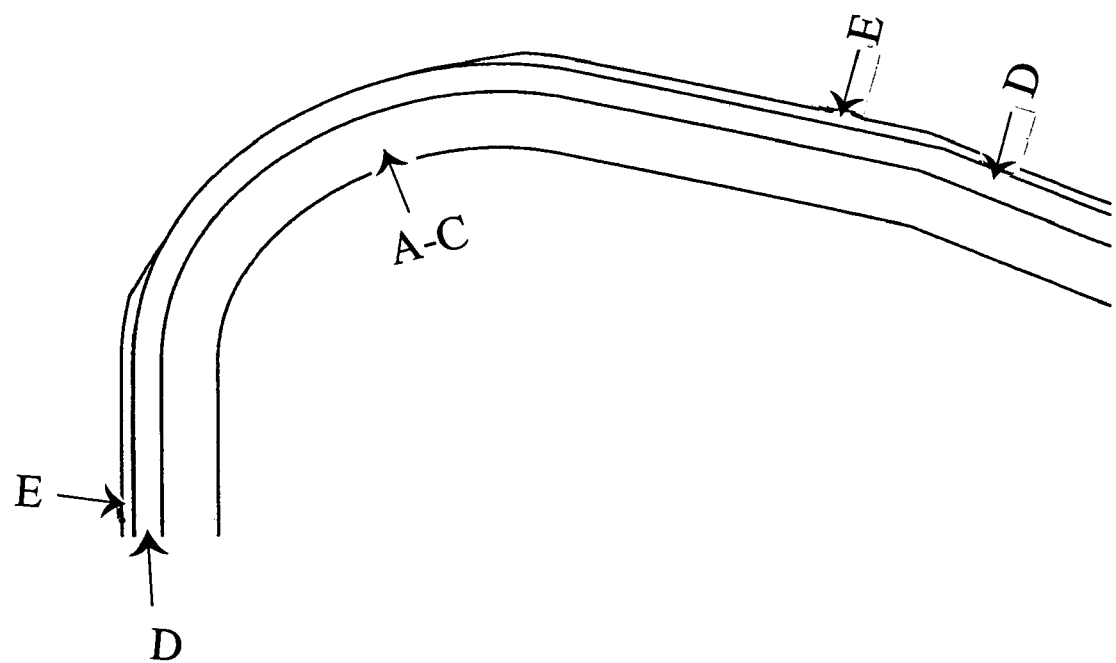
FIG. 3 is a schematic of the cross-section of the edge with a post-treatment according to prior art.

The removal of the outermost layer (E) at the edge-line will expose the $Al_2O_3$ layers in layers along the edge line. The edge-line is defined as the edge-honed portion of the cutting tool insert. The untreated edge-line is illustrated in FIG. 2A and the post-treated edge-line is illustrated in FIGS. 2B and 2C. It is preferable that only the non-oxide top-layer and parts of the multilayer are removed. The $TiC_xN_yO_z$ layers (A+B+C) may, however, be visible on minor parts of the edge line (FIG. 2C).

The cemented carbide body is mainly produced by mixing of powders, ball milling, spray-drying, some pressing method followed by sintering according to conventional methods and pre-treatment before coating.

In an alternative embodiment, the cemented carbide substrate is made in such a way that a cubic carbide depleted and binder phase enriched volume near the surface is obtained by sintering in vacuum after the addition of a small amount of nitrogen. The measured distance from the surface should be from about 5 to about 50 μm until the end of the cubic carbide depletion. In this embodiment, the composition comprises from about 7.0 to about 10.5 wt % Co and from about 4.0 to about 9.0 wt % cubic carbides and balance tungsten carbide (WC). Said cubic carbides may contain substantial amounts of N and O such that certain microstructural constituents should be referred to as, e.g., carbonitride or oxycarbonitride. The cubic carbides are preferably Nb, Ta and Ti but may include carbides of elements from group IVb, Vb or VIb of the periodic table. The amount of N in the substrate should be in the range of from about 0.01 to about 0.2 wt %.

The body is then coated with

- a first (innermost) layer(A) of $TiC_xN_yO_z$ with $x+y+z \leq 1$, preferably y>x and z<0.2, most preferably y>0.8 and z=0, with equiaxed grains with size <0.5 μm and a total thickness <1.5 μm but >0.1 μm using known chemical vapor deposition, CVD, methods.
- a layer of $TiC_xN_yO_z$(B) with $x+y+z \leq 1$, preferably with z=0, x>0.3 and y>0.3 with a thickness of from about 0.4 to about 3.9 μm, preferably from about 1.5 to about 3.0 μm with columnar grains, using preferably a moderate temperature CVD, MTCVD, technique (using acetonitrile as the carbon and nitrogen source for forming the layer in the temperature range of from about 700 to about 900° C.). The exact conditions depend to a certain extent on the design of the equipment used but are within the purview of the skilled artisan.

- a layer of $TiC_xN_yO_z(C)$ with $x+y+z \leq 1$, preferably $y>x$ and $z<0.2$, most preferably $y>0.8$ and $z=0$, with equiaxed grains with size <0.5 μm and a total thickness <1.5 μm but >0.1 μm using known CVD-methods. This layer (C) can be omitted in another embodiment.

The total thickness of the layers A+B+C is from about 0.7 to about 4.5 μm, preferably from about 1.2 to about 4.0 μm. Preferably, the layers A and C are each thinner than layer B.

- a multilayer(D) consisting of a plurality of alternating $Al_2O_3$ and $TiC_xN_yO_z$ ($x+y+z \leq 1$) layers, preferably κ-$Al_2O_3$— and TiN-layers, using known CVD-methods. The innermost and the outermost layer of the multilayer sequence are $Al_2O_3$-layers. The total number of layers, including both the $TiC_xN_yO_z$— and $Al_2O_3$-layers, is between about 5 and about 31, preferably about 11 and about 15 layers. The $Al_2O_3$-layers have an individual layer thickness of <0.5 μm, preferably from about 0.2 to about 0.5 μm. The $TiC_xN_yO_z$-layers have an individual layer thickness of from about 0.01 to about 0.2 μm, preferably from about 0.02 to about 0.15 μm. The total thickness of the multilayer is from about 1.0 to about 4.0 μm, preferably from about 1.5 to about 3.5 μm. The grain size of the $Al_2O_3$-layer is equal to or less than the thickness of the $Al_2O_3$-layer.

preferably, an outermost layer system(E) consisting of one or several layers in sequence of $TiC_xN_y$ ($x+y \leq 1$) or combinations thereof using known CVD-methods. The total thickness is <1.5 μm.

G. the total thickness of layers A–E is from about 2.0 to about 8.0 μm.

The coating is mechanically post-treated to expose the multilayer along the edge line by a brushing, blasting, grinding operation or combinations thereof such that the areas on the rake and flank face with chip and work piece contact respectively have been treated.

In the preferred method, two nylon brushes containing SiC grains with settings and insert positioning such that one brush mainly brushes the rake side and the other mainly the flank side to achieve the desired properties on the flank and rake face of the insert.

The invention is additionally illustrated in connection with the following Examples, which are to be considered as illustrative of the present invention. It should be understood, however, that the invention is not limited to the specific details of the Examples.

EXAMPLES

The following inserts and examples are selected to exemplify the advantages with the invention. These examples are summarised in Table 1.

The presented inserts have been tested with identical conditions in each example.

Insert A. Cemented carbide turning inserts according to the invention with the composition 8.75 wt % Co, 1.17 wt % Ta, 0.29 wt % Nb and balance made up by WC and with an average WC grain size of 2.0 μm were coated with 0.5 μm TiN (innermost layer), 2.2 μm columnar Ti(C,N), and 0.5 μm equiaxed TiN, 2.2 μm (κ-$Al_2O_3$+TiN)$_6$κ-$Al_2O_3$ multilayer with 250 nm thick κ-$Al_2O_3$-layers and 80 nm thick TiN-layers and an outermost layer of 0.5 μm TiN+TiC+TiN. The coating was post-treated along the edge line with nylon brushes containing SiC grains. The outermost coating was removed a=0.1 mm and b=0.05 mm into the rake and flank face.

Insert B. (Prior Art) Commercial cemented carbide turning inserts having 10.5 wt % Co, 1.16 wt % Ta, 0.28 wt % Nb and balance made up by WC and with an average grain size of 1.7 μm, was coated with an innermost 0.5 μm equiaxed TiN layer, 4.0 μm columnar Ti(C,N), 1.0 μm κ-$Al_2O_3$, and an outermost layer of 0.5 μm TiN+TiC+TiN. The coating was brushed along the edge line with nylon straw brushes containing SiC grains. The outermost coating was removed a=0.025 mm and b=0.05 mm along the edge line according to prior art.

Insert C. (Comparative) Cemented carbide turning inserts with the composition 9.15 wt % Co, 1.17 wt % Ta, 0.29 wt % Nb and balance made up by WC and with an average WC grain size of 1.7 μm, were coated with 0.5 μm TiN (innermost layer), 2.2 μm columnar TiCN, a 1.8 μm (κ-$Al_2O_3$+TiN)$_5$κ-$Al_2O_3$ multilayer, and an outermost layer of 0.5 μm TiN. The coating was post-treated along the edge line with nylon brushes containing SiC grains. The outermost coating was removed a=0.025 mm and b=0.05 mm along the edge line, according to prior art.

Insert D. (Comparative) Identical substrates to C were coated with 0.5 μm TiN (innermost layer), 2.3 μm columnar Ti(C,N), a 1.9 μm (κ-$Al_2O_3$+TiN)$_3$κ-$Al2O3$ multilayer, and an outermost layer of 0.5 μm TiN. The coating was post-treated along the edge line with nylon brushes containing SiC grains. The outermost coating was removed a=0.025 mm and b=0.05 mm along the edge line according to prior art.

Insert E. (Prior Art) Identical substrates to C were coated with an innermost 0.5 μm equiaxed TiN layer, 2.2 μm columnar Ti(C,N), 1.5 μm κ-$Al_2O_3$, and an outermost layer of 0.5 μm TiN+TiC+TiN. The outermost coating was removed a=0.025 mm and b=0.05 mm along the edge line according to prior art.

Insert F. Cemented carbide turning inserts having 7.5 wt % Co, 2.72 wt % Ta, 0.44 wt % Nb, 1.83 wt % Ti, 0.09 wt % N and balance made up by WC and with an average grain size of 2.0 μm and with a binder phase enriched and cubic carbide free zone 26 μm from the surface were coated with 0.5 μm TiN (innermost layer), 2.2 μm columnar Ti(C,N), and 0.5 μm equiaxed TiN, 2.2 μm (κ-$Al_2O_3$+TiN)$_6$κ-$Al_2O_3$ multilayer and an outermost layer of 0.5 μm TiN+TiC+TiN.

The coating was post-treated along the edge line with nylon brushes containing SiC grains. The outermost coating was removed a=0.1 mm and b=0.05 mm into the rake and flank face.

Insert G. (Prior Art) Commercial cemented carbide turning inserts having 7.5 wt % Co, 2.72 wt % Ta, 0.44 wt % Nb, 1.83 wt % Ti, 0.09 wt % N and balance made up by WC and with an average grain size of 2.0 μm and with a binder phase enriched and cubic carbide free zone 26 μm from the surface were coated with an innermost 0.5 μm equiaxed TiN layer, 7.5 μm columnar Ti(C,N), 1.2 μm κ-$Al_2O_3$, and an outermost layer of 0.5 μm TiN+TiC+TiN.

The coating was brushed along the edge line with nylon straw brushes containing SiC grains. The outermost coating was removed a=0.025 mm and b=0.05 mm along the edge line as disclosed in EP-A-693574.

Example 1

Inserts from A and B were tested in a turning operation.

| | |
|---|---|
| Operation: | Axial and facial turning in a bar |
| Work piece material: | Austenitic stainless steel AISI 316L |
| Cutting Speed: | 225 m/min |
| Feed rate: | 0.3 mm/rev |
| Depth of cut: | 2.0 mm |
| Insert style: | CNMG120408-MM |
| Results: | Tool life (min) |
| Insert A: (invention) | ca 10 |
| Insert B: (prior art) | ca 6 |

Comment: Tool life criterion was maximum flank wear 0.3 mm of the cutting edge line. The wear develops irregularly due to local plastic deformation. This example shows the improvement in plastic deformation resistance.

Example 2

Inserts from A and B were tested in a turning operation.

| | |
|---|---|
| Operation: | Intermittent cutting of an assembly part |
| Work piece material: | Austenitic stainless steel, AISI316L |
| Cutting speed: | 160 m/min |
| Feed rate: | 0.2–0.3 mm/rev |
| Depth of cut: | 0.5–1.5 mm |
| Insert style: | SNMG120412-MR |
| Results: | Tool life (min) |
| Insert A: (invention) | 8.2 |
| Insert B: (prior art) | 4.2 |

Comment: The wear in this test was flank wear, thermal cracks, chipping. The tool-life-determining criterion is chipping i.e. edge toughness. Consequently it shows improved edge toughness in combination with maintained properties in other wear modes.

Example 3

Inserts from A and B were tested in a turning operation.

| | |
|---|---|
| Operation: | Continuous cutting in a cast ring |
| Work piece material: | Austenitic stainless steel, AISI316L |
| Cutting speed: | 110 m/min |
| Feed rate: | 0.3 mm/rev |
| Depth of cut: | 3.5 mm |
| Insert style: | CNMG120412-MR |
| Results: | Tool life (min) |
| Insert A: (invention) | 18.6 |
| Insert B: (prior art) | 12.4 |

Comment: The criterion in this test is working through a full item taking total time in cut 6.2 min without showing excessive flank wear or edge damage. The critical wear criteria are flank wear and plastic deformation in combination.

The insert according to the invention shows improvements in these respects.

Example 4

Inserts from A and B were tested in a turning operation.

| | |
|---|---|
| Operation: | Continuous cutting of a housing |
| Work piece material: | Duplex stainless steel, SS2377 |
| Cutting speed: | 110 m/min |
| Feed rate: | 0.3 mm/rev |
| Depth of cut: | 1.35 mm |
| Insert style: | WNMG080412-MR |
| Results: | Tool life (min) |
| Insert A: (invention) | 46 |
| Insert B: (prior art) | 24 |

Comment: This test shows a clear improvement compared to prior art. It is however difficult in this example to determine one single critical wear but it can be described as a combination of flank wear, flaking on rake and edge toughness.

Example 5

Inserts from A and B were tested in a turning operation.

| | |
|---|---|
| Operation: | Intermittent cutting of a cast |
| Work piece material: | Austenitic stainless steel, AISI316 |
| Cutting speed: | 150–200 m/min |
| Feed rate: | 0.1–0.15 mm/rev |
| Depth of cut: | 2.0 mm |
| Insert style: | CNMG120412-PR |
| Results: | Tool life (items) |
| Insert A: (invention) | 7 |
| Insert B: (prior art) | 2 |

Comment: This test shows improvement in toughness since the main wear criterion is edge toughness in this demanding application.

Example 6

Illustrative

Inserts from C and D were tested in a turning operation.

Figure 4:
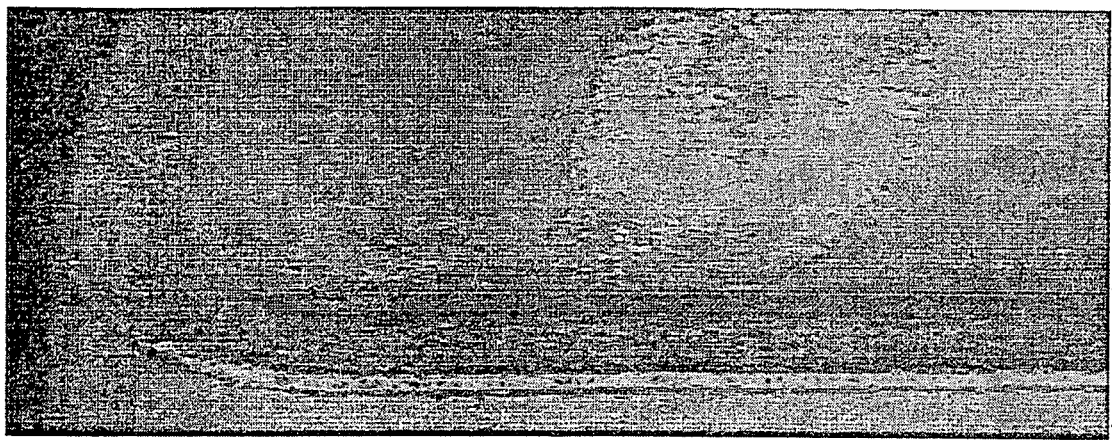
FIG. 4 is a SEM picture of the edge post-treated according to the invention.
Figure 5:
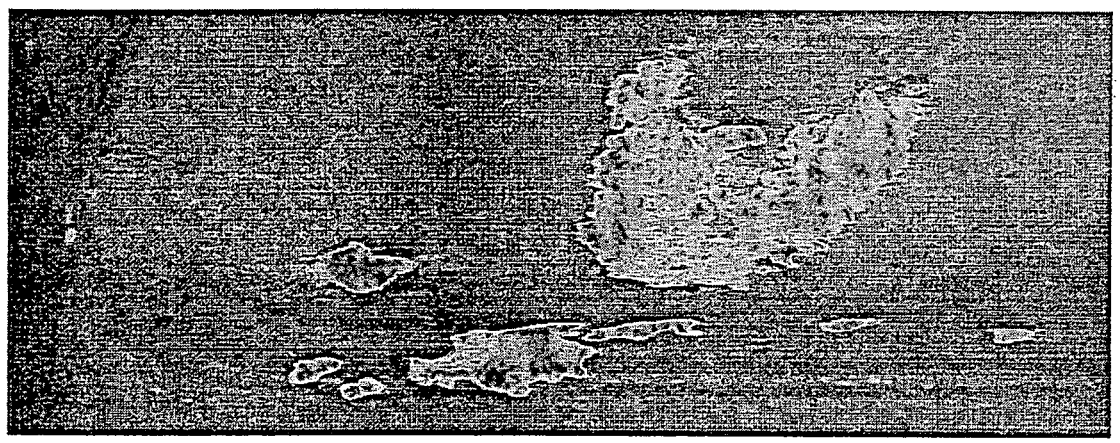
FIG. 5 is a SEM picture of the post-treated edge of reference with thicker individual alumina layers (Insert D).

| | |
|---|---|
| Operation: | Facing of a bar |
| Work piece material: | Austenitic stainless steel, AISI304L |
| Cutting speed: | 140 m/min |
| Feed rate: | 0.36 mm/rev |
| Depth of cut: | maximum 4 mm |
| Insert style: | CNMG120408-MM |
| Results: | Wear pattern |
| Insert C: (reference) | Limited flaking on rake (FIG. 4) |
| Insert D: (reference) | Widespread flaking on rake (FIG. 5) |

Comment: This example shows improved flaking resistance compared to the reference implying the importance of alumina layer thickness.

Example 7

Illustrative

Inserts from C and E were tested in a turning operation.

| | |
|---|---|
| Operation: | Combined facing and longitudinal turning |
| Work piece material: | Austenitic stainless steel, AISI316Ti |
| Cutting speed: | 100–120 m/min |
| Feed rate: | 0.3 mm/rev |
| Depth of cut: | 2.0 mm |
| Insert style: | CNMG120408-MM |
| Results: | Total damaged edge outside cut |
| Insert C: (reference) | 11.5 mm |
| Insert E: (prior art) | 14.7 mm |

Comment: Main wears are notch wear of the cutting depth and chipping outside the part of the edge in cut.

The example shows that the thin multilayer coating adds edge toughness compared to a coating according to prior art.

Example 8

Illustrative

Inserts from C and E were tested in a turning operation.

| | |
|---|---|
| Operation: | Combined facing and longitudinal turning |
| Work piece material: | Austenitic stainless steel, AISI304L |
| Cutting speed: | 225 m/min |
| Feed rate: | 0.3 mm/rev |
| Depth of cut: | 2.0 mm |
| Insert style: | CNMG120408-MM |
| Results: | Tool life (min) |
| Insert C: (reference) | 18 |
| Insert E: (prior art) | 13 |

Comment: Tool life criterion was maximum flank wear 0.3 mm of the cutting edge line. The wear develops irregularly due to local plastic deformation. This example shows that the thin multilayer coating add plastic deformation resistance compared to a coating according to prior art in this operation.

Considering example 7 this shows an improvement in these contradictory properties.

Example 9

Inserts from F and G were tested in a turning operation.

| | |
|---|---|
| Operation: | Continuous cutting in a forged component |
| Work piece material: | Austenitic stainless steel, AISI316L |
| Cutting speed: | 200 m/min |
| Feed rate: | 0.3 mm/rev |
| Depth of cut: | 2.0 mm |
| Insert style: | CNMG120416-MM |
| Results: | Tool life (pcs) |
| Insert F: (invention) | 32 |
| Insert G: (prior art) | 19 |

Comment: The critical wear criteria are flank wear and plastic deformation in combination in this test. The insert according to the invention shows improvement in these respects.

TABLE 1

| | A (invention) | B (prior art) | C (outside invention) | D (outside invention) | E (prior art) | F (invention) | G (prior art) |
|---|---|---|---|---|---|---|---|
| Substrate | | | | | | | |
| Co/Ta/Nb (wt %) | 8.75/1.17/0.29 | 10.5/1.16/0.28 | 9.15/1.17/0.29 | 9.15/1.17/0.29 | 9.15/1.17/0.29 | 7.5/2.72/0.44 | 7.5/2.72/0.44 |
| Ti/N (wt %) | —/— | —/— | —/— | —/— | —/— | 1.83/0.09 | 1.83/0.09 |
| Coating | | | | | | | |
| TiN (innermost layer) | 0.5 μm | 0.5 μm | 0.5 μm | 0.5 μm | 0.5 μm | 0.5 μm | 0.5 μm |
| Ti (C,N) | 2.2 μm | 4.0 μm | 2.2 μm | 2.3 μm | 2.2 μm | 2.2 μm | 7.5 μm |
| TiN | 0.5 μm | — | — | — | — | 0.5 μm | — |
| $(Al_2O_3/TiN)_x Al_2O_3$ or solid $Al_2O_3$ | 1.0 μm 2.2 μm, x = 6 | 1.8 μm, x = 5 | 1.9 μm, x = 3 solid $Al_2O_3$ | 1.5 μm | 2.2 μm, x = 6 solid $Al_2O_3$ | 1.2 μm | solid $Al_2O_3$ |
| TiN + TiC + TiN | 0.5 μm | 0.5 μm | 0.5 μm | 0.5 μm | 0.5 μm | 0.5 μm | 0.5 μm |
| Post treatment | Acc to invention | Prior art | Prior art | Prior art | Prior art | Acc to invention | Prior art |
| Results | | | | | | | |
| 1. plastic deformation (tool life) | 10 min | 6 min | | | | | |
| 2. combined wear (tool life) | 8.2 min | 4.2 min | | | | | |
| 3. toughness and wear resistance (tool life) | 18.6 min | 12.4 min | | | | | |
| 4. toughness and adhesion (tool life) | 46 min | 24 min | | | | | |
| 5. toughness (no of items) | 7 items | 2 items | | | | | |
| 6. flaking | | | Limited | Widespread | | | |
| 7. edge toughness (damaged length) | | | 11.5 mm | | 14.7 mm | | |
| 8. plastic deformation (tool life) | | | 18 min | | 13 min | | |

TABLE 1-continued

| | A (invention) | B (prior art) | C (outside invention) | D (outside invention) | E (prior art) | F (invention) | G (prior art) |
|---|---|---|---|---|---|---|---|
| 9. flank wear and plastic deformation (no of items) | | | | | | 32 items | 19 items |

In conclusion it can be stated that from the result of the examples given above it is evident that by combining a cemented carbide substrate with the given composition, the selection of the multilayered coating with specific thicknesses and the special edge treatment a tool insert has been created with excellent cutting performance in that it combines much of what was believed to be contradictory properties as described in the introduction.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

The invention claimed is:

1. A coated cemented carbide cutting tool insert, said coating comprising:
   a first, innermost layer system of at least two layers of $TiC_xN_yO_z$ with $x+y+z \leq 1$; and
   a second multilayer system comprising from about 5 to about 31 alternating layers of $Al_2O_3$ and $TiC_xN_yO_z$ ($x+y+z \leq 1$), the $Al_2O_3$-layers having an individual layer thickness of <0.5 μm and the $TiC_xN_yO_z$-layers from about 0.01 to about 0.2 μm with a total thickness of the multilayer from about 1.0 to about 4.0 μm, and wherein the multilayer is exposed along the edge line and into the rake and flank face, such that the exposure on the rake face (a) is greater than about 0.03 and less than about 0.9 mm, the exposure on the flank face (b) is greater than about 0.02 and less than about 0.2 mm and a>b.

2. The insert of claim 1 wherein the said second multilayer system comprises from about 11 to about 15 alternating layers of κ-$Al_2O_3$ and TiN, the κ-$Al_2O_3$-layers having an individual layer thickness of from about 0.2 to about 0.5 μm and the TiN layers from about 0.02 to about 0.15 μm with a total thickness of the multilayer from about 1.5 to about 3.5 μm.

3. The cutting tool of claim 1 wherein the innermost layer system comprises:
   a first layer $TiC_xN_yO_z$ with $x+y+z \leq 1$ with equiaxed grains with size <0.5 μm and a total thickness <1.5 μm but >0.1 μm, and
   a second layer of $TiC_xN_yO_z$ with $x+y+z \leq 1$ with a thickness of from about 0.4 to about 3.9 μm with columnar grains.

4. The cutting tool of claim 3 wherein the innermost layer system comprises:
   a first layer $TiC_xN_yO_z$ with y>0.8 and z=0, with equiaxed grains with size <0.5 μm and a total thickness from about 0.1 to about 0.6 μm, and
   a second layer of $TiC_xN_yO_z$ with x>0.5 with a thickness of from about 1.5 to about 3.0 μm with columnar grains.

5. Cutting tool of claim 3 the innermost layer system further comprises a third layer of $TiC_xN_yO_z$ with $x+y+z \leq 1$ with equiaxed grains with size <0.5 μm and a total thickness <1.5 μm but >0.1 μm.

6. Cutting tool of claim 3 the innermost layer system further comprises a third layer of $TiC_xN_yO_z$ with y>x and z<0.2 with equiaxed grains with size <0.5 μm and a total thickness from about 0.2 to about 0.8 μm.

7. Cutting tool of claim 6 the innermost layer system further comprises a third layer of $TiC_xN_yO_z$ with y>0.8 and z=0 with equiaxed grains with size <0.5 μm and a total thickness from about 0.2 to about 0.8 μm.

8. The cutting tool of claim 1 wherein the innermost layer system comprises:
   a first layer $TiC_xN_yO_z$ with y>x and z<0.2 with equiaxed grains with size <0.5 μm and a total thickness from about 0.1 to about 0.6 μm, and
   a second layer of $TiC_xN_yO_z$ with z=0, x>0.3 and y>0.3 with a thickness of from about 1.5 to about 3.0 μm with columnar grains.

9. Cutting tool of claim 1 wherein the total thickness of the innermost layer system is from about 0.7 to about 4.5 μm.

10. Cutting tool of claim 1 wherein the total thickness of the innermost layer system is from about 1.2 to about 4.0 μm.

11. Cutting tool of claim 1 wherein there is an outermost layer system on top of the multilayer comprising one or more layers of $TiC_xN_y$ ($x+y \leq 1$) or combinations thereof.

12. Cutting tool of claim 1 wherein there is an outermost layer system on top of the multilayer comprising three layers in sequence of TiN, TiC and TiN or combinations thereof.

13. The cutting tool of claim 1 wherein the total thickness of the coating is from about 2.0 to about 8.0 μm.

14. The cutting tool of claim 1 wherein the total thickness of the coating is from about 4.0 to about 7.0 μm.

15. The cutting tool of claim 1 wherein the multilayer and partly the innermost $TiC_xN_yO_z$ layer system is exposed along the edge line.

16. The cutting tool of claim 1 wherein the cemented carbide substrate has a composition of from about 7 to about 10.5 wt % Co from about 0.2 to about 1.6 wt % cubic carbides, and balance WC with an average grain size of from about 1.5 to about 3.5 μm.

17. The cutting tool of claim 1 wherein the cemented carbide substrate has a composition of from about 8.0 to about 9.5 wt % Co, from about 0.4 to about 1.0 wt % cubic carbides of the metals Ta, Nb and Ti and possibly other carbides of the elements from group IVb, Vb or VIb of the periodic table and balance WC with an average grain size of from about 1.9 to about 2.1 μm.

18. The cutting tool of claim 1 wherein the cemented carbide substrate has a cubic carbide depleted and binder phase enriched volume near the surface with a distance from the surface of from about 5 to about 50 μm with a substrate composition comprising from about 7.0 to about 10.5 wt % Co and from about 4.0 to about 9.0 wt % cubic carbides of elements from group IVb, Vb or VIb of the periodic table preferably Nb, Ta and/or Ti and balance tungsten carbide, WC and an N-content in the range of from about 0.01 to about 0.2 wt %.

* * * * *